(12) United States Patent
He et al.

(10) Patent No.: US 12,092,682 B2
(45) Date of Patent: Sep. 17, 2024

(54) METHOD AND SYSTEM FOR DIAGNOSING OPEN CIRCUIT (OC) FAULT OF T-TYPE THREE-LEVEL (T²3L) INVERTER UNDER MULTIPLE POWER FACTORS

(71) Applicant: WUHAN UNIVERSITY, Wuhan (CN)

(72) Inventors: Yigang He, Wuhan (CN); Weiwei Zhang, Wuhan (CN); Xiao Wang, Wuhan (CN); Xiaoyu Liu, Wuhan (CN); Liulu He, Wuhan (CN); Mingyun Chen, Wuhan (CN)

(73) Assignee: WUHAN UNIVERSITY, Wuhan (CN)

( * ) Notice: Subject to any disclaimer, the term of this patent is extended or adjusted under 35 U.S.C. 154(b) by 130 days.

(21) Appl. No.: 18/054,914

(22) Filed: Nov. 14, 2022

(65) Prior Publication Data

US 2023/0152364 A1 May 18, 2023

(30) Foreign Application Priority Data

Nov. 15, 2021 (CN) .......................... 202111346483.7

(51) Int. Cl.
*G01R 31/26* (2020.01)
*G01R 31/28* (2006.01)

(52) U.S. Cl.
CPC ..... *G01R 31/2608* (2013.01); *G01R 31/2843* (2013.01)

(58) Field of Classification Search
CPC .................. G01R 31/2608; G01R 31/2843
See application file for complete search history.

(56) References Cited

U.S. PATENT DOCUMENTS

| 9,182,446 | B2 | 11/2015 | Liu et al. |
| 10,288,686 | B2 | 5/2019 | Takamura et al. |
| 10,598,731 | B2 | 3/2020 | Miller et al. |
| 2020/0036279 | A1* | 1/2020 | Li ........................... H02M 1/08 |

* cited by examiner

*Primary Examiner* — Alesa Allgood
(74) *Attorney, Agent, or Firm* — True Shepherd LLC; Andrew C. Cheng (57) ABSTRACT

A method and a system for diagnosing an open circuit (OC) fault of an insulated gate bipolar transistor (IGBT) of a T-type three-level (T²3L) inverter under multiple power factors based on instantaneous current distortion are provided. Similar characteristics of current distortion may be caused by an OC fault of a T²3L inverter, making it is difficult to locate the fault. The method for diagnosing an OC fault of a grid-connected T²3L inverter, can diagnose the OC fault hierarchically; four switch transistors in a phase can be divided into two groups according to the similarity analysis of current distortion under different power factors; group-based fault diagnosis is realized by half cycles in which a zero domain occurs; and then, a specific switching signal is injected to realize equipment-based OC fault diagnosis. The OC fault diagnosis of a T²3L inverter is realized without additional hardware circuits.

5 Claims, 4 Drawing Sheets

METHOD AND SYSTEM FOR DIAGNOSING OPEN CIRCUIT (OC) FAULT OF T-TYPE THREE-LEVEL (T²3L) INVERTER UNDER MULTIPLE POWER FACTORS

CROSS-REFERENCE TO RELATED APPLICATIONS

This application claims priority to Chinese Patent Application No. 2021111346483.7 with a filing date of Nov. 15, 2021. The content of the aforementioned application, including any intervening amendments thereto, is incorporated herein by reference.

TECHNICAL FIELD

The present disclosure relates to the technical field of fault diagnosis of power electronic equipment, and more specifically, to a method and a system for diagnosing an open circuit (OC) fault of an insulated gate bipolar transistor (IGBT) of a T-type three-level (T²3L) inverter under multiple power factors based on instantaneous current distortion.

BACKGROUND

A multi-level inverter has been widely used in photovoltaic grid connection, uninterruptible power supply, electric vehicles, and other occasions with high requirements for efficiency and quality of electric energy. In addition, a multi-level topology increases the risk of equipment fault. Considering structural complexity, quality of output electric energy, and economical efficiency, a neutral-point-clamped (NPC) three-level inverter and a T²3L inverter have become two popular topologies due to their low dv/dt and low harmonic distortion. Compared with an NPC three-level topology, a T²3L topology reduces two diodes in each electric bridge. In addition, rated voltages of two inner transistors ($S_{X3}$ and $S_{X4}$) are less than those of two outer transistors ($S_{X1}$ and $S_{X2}$), thereby reducing switching loss. What's more, the T²3L topology has a competitive advantage over the NPC three-level topology in fault tolerant control.

Power switches (such as an IGBT and a SiC) are key and vulnerable devices of the inverter. Switch faults include a short circuit (SC) fault and an OC fault. The SC fault can be converted into the OC fault by using a built-in hardware detection and protection means (such as a desaturation detection circuit). However, the OC fault is often ignored by a hardware protection device, and may deviate the system from a normal operation state without immediately stopping the system. A distorted current, a distorted voltage or abnormal voltage stress of a remaining semiconductor device are common problems caused by the OC fault. Therefore, there is an urgent demand for detecting and locating the OC fault.

At present, OC fault diagnosis of the T²3L inverter still needs to be improved, and existing OC fault diagnosis cannot be applied to a working condition with multiple power factors.

SUMMARY

In order to overcome the above defects or meet the above improvement requirements in the prior art, the present disclosure provides a method and a system for diagnosing an OC fault of an IGBT of a T²3L inverter under multiple power factors based on instantaneous current distortion, to diagnose OC faults under different power factors, and achieve simple calculation and logical judgment.

To achieve the above objective, according to an aspect of the present disclosure, a method for diagnosing an OC fault of an IGBT of a T²3L inverter under multiple power factors based on instantaneous current distortion is provided, including:

collecting target parameters of a T²3L inverter in real time, where the target parameters include an output current $i_X$; a grid-connected current command $i_{d\_ref}$ of axis d, a grid-connected current command $i_{q\_ref}$ of axis q, a grid voltage $e_X$, and a switching cycle $T_s$, and X represents a fault phase;

calculating a theoretical zero crossing point based on the target parameters to obtain positive and negative half-cycle regions, determining positive and negative half cycles in which a zero domain occurs, performing group-based OC fault diagnosis, and outputting a group-based fault diagnosis signal;

injecting a specific switching signal to a space vector pulse width modulation (SVPWM) or sinusoidal pulse width modulation (SPWM) module based on the group-based fault diagnosis signal; and determining, based on a current value $i_X$ under the specific switching signal, whether a current is in the zero domain, performing equipment-based OC fault diagnosis, and outputting an equipment-based fault diagnosis signal.

In some optional implementation solutions, when a power factor pf is greater than or equal to 0, theoretical zero crossing points $t_{p2z}$ and $t_{n2z}$ are obtained according to:

$$\begin{cases} t_{n2z} = T_s - t_{pf} \\ t_{p2z} = T_s/2 - t_{pf} \end{cases};$$

and when the power factor pf is less than 0, the theoretical zero crossing points $t_{p2z}$ and $t_{n2z}$ are obtained according to $$\begin{cases} t_{n2z} = t_{pf} \\ t_{p2z} = T_s/2 + t_{pf} \end{cases},$$

wherein $t_{p2z}$ represents time when the current changes from a positive current to a zero current, $t_{n2z}$ represents time when the current changes from a negative current to the zero current, $T_s$ represents the switching cycle, and $t_{pf}$ represents leading or lagging time under different power factors.

In some optional implementation solutions, the leading or lagging time $t_{pf}$ under different power factors is obtained according to $$t_{pf} = \frac{\theta}{2\pi f_s},$$

wherein θ represents a power factor angle, and $f_s$ represents a switching frequency.

In some optional implementation solutions, the power factor angle $\theta$ is obtained according to:

$$\cos(\theta) = \frac{i_{d\_ref}}{\sqrt{i_{d\_ref}^2 + i_{q\_ref}^2}},$$

wherein $i_{d\_ref}$ and $i_{q\_ref}$ represent the grid-connected current commands of axis d and axis q respectively.

In some optional implementation solutions, rules for group-based OC fault diagnosis are as follows:

| Group-based fault | Range in which the zero domain occurs | $zs_{n2z} + zs_{p2z}$ | pf |
|---|---|---|---|
| $F_{X1/4}$ | $(t_{n2z} + D_{th}, T_s\text{-}D_{th}) \cup (D_{th}, t_{p2z}\text{-}D_{th})$ | 1 | pf ≥ 0 |
|  | $(t_{n2z} + D_{th}, t_{p2z}\text{-}D_{th})$ | 1 | pf < 0 |
| $F_{X2/3}$ | $(t_{p2z} + D_{th}, t_{n2z}\text{-}D_{th})$ | 1 | pf ≥ 0 |
|  | $(t_{p2z} + D_{th}, T_s\text{-}D_{th}) \cup (D_{th}, t_{n2z}\text{-}D_{th})$ | 1 | pf < 0 |

As described above, $F_{X1/4}$ and $F_{X2/3}$ represent group-based fault diagnosis signals, $t_{n2z}$ and $t_{p2z}$ represent the theoretical zero crossing points, $D_{th}$ represents a first preset time threshold, $zs_{n2z}$ represents a zero-domain mark from the negative current to the zero current, $zs_{p2z}$ represents a zero-domain mark from the positive current to the zero current, pf represents the power factor, pf>0 indicates that the current leads a voltage, and pf<0 indicates the current lags behind the voltage.

In some optional implementation solutions, in the step of injecting a specific switching signal to an SVPWM or SPWM module based on the group-based fault diagnosis signal:

when $F_{X1/4}$ is 1, specific switching signals $[S_{A1}, S_{A3}, S_{A2}, S_{A4}]$ are $[1,0,0,0]$; and when $F_{X2/3}$ is 1, the specific switching signals $[S_{A1}, S_{A3}, S_{A2}, S_{A4}]$ are $[0,0,1,0]$.

In some optional implementation solutions, rules for equipment-based OC fault diagnosis are as follows:

| Equipment-based fault | Group-based fault | $[S_{X1}, S_{X3}, S_{X2}, S_{X4}]$ | $|i_X|$ | N |
|---|---|---|---|---|
| $F_{X1}$ | $F_{X1/4}$ | $[1, 0, 0, 0]$ | $\leq I_{th2}$ | $\geq N_{th}$ |
| $F_{X4}$ |  |  | $> I_{th2}$ | $< N_{th}$ |
| $F_{X2}$ | $F_{X2/3}$ | $[0, 0, 1, 0]$ | $\leq I_{th2}$ | $\geq N_{th}$ |
| $F_{X3}$ |  |  | $> I_{th2}$ | $< N_{th}$ |

As described above, $I_{th2}$ represents a preset current threshold, N represents duration in which the current is in the zero domain, $N_{th}$ represents a second preset time threshold, and $F_{XY}(Y=1, 2, 3, 4)$ represents the equipment-based fault diagnosis signal.

According to another aspect of the present disclosure, a system for diagnosing an OC fault of an IGBT of a $T^2 3L$ inverter under multiple power factors based on instantaneous current distortion is provided, including:

a parameter obtaining module configured to collect target parameters of a $T^2 3L$ inverter in real time, where the target parameters include an output current $i_X$, a grid-connected current command $i_{d\_ref}$ of axis d, a grid-connected current command $i_{q\_ref}$ of axis q, a grid voltage $e_X$, and a switching cycle $T_s$, and X represents a fault phase;

a group-based fault diagnosis module configured to calculate a theoretical zero crossing point based on the target parameters to obtain positive and negative half-cycle regions, determine positive and negative half cycles in which a zero domain occurs, perform group-based OC fault diagnosis, and output a group-based fault diagnosis signal;

a specific-switching signal injection module configured to inject a specific switching signal to an SVPWM or SPWM module based on the group-based fault diagnosis signal; and an equipment-based fault diagnosis module configured to determine, based on a current value $i_X$ under the specific switching signal, whether a current is in the zero domain, perform equipment-based OC fault diagnosis, and output an equipment-based fault diagnosis signal.

According to still another aspect of the present application, a computer-readable storage medium is provided. The computer-readable storage medium stores a computer program, and the computer program is executed by a processor to implement the steps of the method according to any one of the above-mentioned aspects.

Compared with the prior art, the above technical solutions conceived by the present disclosure can achieve the following beneficial effects:

(1) The present disclosure implements a method for diagnosing an OC fault of an IGBT under multiple power factors based on instantaneous current distortion, to diagnose OC faults under different power factors.

(2) The present disclosure uses the instantaneous current distortion as a diagnostic variable, which can realize fast fault diagnosis with average diagnosis time of about 6 ms.

DETAILED DESCRIPTION OF THE EMBODIMENTS

To make the objectives, technical solutions, and advantages of the present disclosure clearer, the present disclosure is further described below in detail with reference to the drawings and embodiments. Understandably, the specific embodiments described herein are merely intended to explain the present disclosure but not to limit the present disclosure. Further, the technical features involved in the various implementations of the present disclosure described below may be combined with each other as long as they do not constitute a conflict with each other.

In the embodiments of the present disclosure, the terms such as "first" and "second" are intended to distinguish between different objects, rather than describe a specific order or sequence.

Embodiment 1

Figure 1:
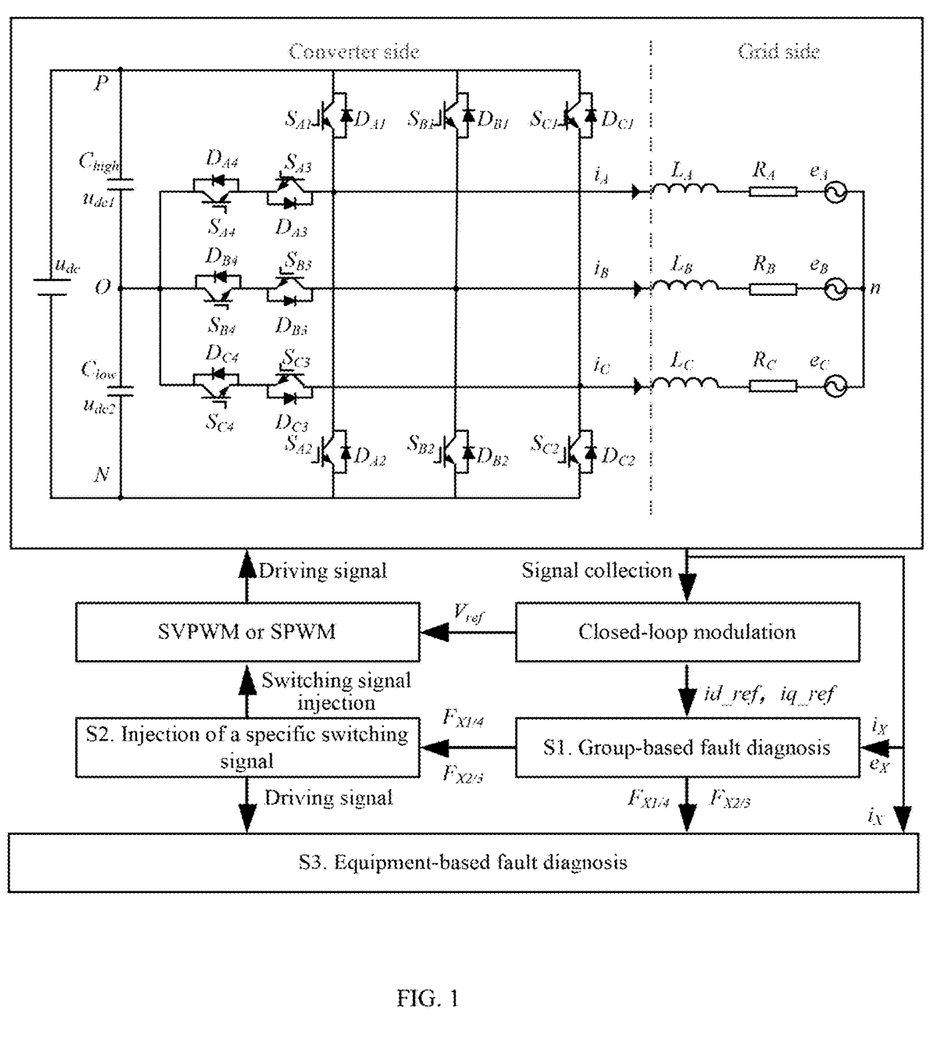
FIG. 1 is a schematic flowchart of a method for diagnosing an OC fault of an IGBT under multiple power factors based on instantaneous current distortion according to an embodiment of the present disclosure.

The present disclosure summarizes characteristics of current distortion in the case of an OC fault, and realizes OC fault diagnosis based on the characteristics of the current distortion. As shown in FIG. 1, a method for diagnosing an OC fault of an IGBT under multiple power factors based on instantaneous current distortion according to the present disclosure includes the following steps:

S1: Collect an output current $i_X$(X=A, B, C), grid-connected current commands $i_{d\_ref}$ and $i_{q\_ref}$, and a grid voltagee$_X$ of a T$^2$3L inverter in real time, obtain a system parameter, namely, a switching cycle $T_s$, calculate a theoretical zero crossing point to obtain positive and negative half-cycle regions, determine positive and negative half cycles in which a zero domain occurs, perform group-based OC fault diagnosis, and output a group-based fault diagnosis signal $F_{X1/4}$ or $F_{X2/3}$.

S2: Inject a specific switching signal to an SVPWM or SPWM module based on the group-based fault diagnosis signal.

S3: Determine, based on a current value $i_X$ under the specific switching signal, whether a current is in the zero domain, perform equipment-based OC fault diagnosis, and output an equipment-based fault diagnosis signal $F_{XY}$(Y=1, 2, 3, 4).

When a power factor pf is greater than or equal to 0, theoretical zero crossing points $t_{p2z}$ and $t_{n2z}$ are obtained according to:

$$\begin{cases} t_{n2z} = T_s - t_{pf} \\ t_{p2z} = T_s/2 - t_{pf} \end{cases};$$

and when the power factor pf is less than 0, the theoretical zero crossing points $t_{p2z}$ and $t_{n2z}$ are obtained according to:

$$\begin{cases} t_{n2z} = t_{pf} \\ t_{p2z} = T_s/2 + t_{pf} \end{cases};$$

wherein $t_{p2z}$ represents time when the current changes from a positive current to a zero current, $t_{n2z}$ represents time when the current changes from a negative current to the zero current, $T_s$ represents the switching cycle, and $t_{pf}$ represents leading or lagging time under different power factors.

Specifically, $t_{pf}$ is obtained according to:

$$t_{pf} = \frac{\theta}{2\pi f_s},$$

wherein θ represents a power factor angle, and $f_s$ represents a switching frequency.

The power factor angle θ is calculated according to:

$$\cos(\theta) = \frac{i_{d\_ref}}{\sqrt{i_{d\_ref}^2 + i_{q\_ref}^2}},$$

wherein $i_{d\_ref}$ and $i_{q\_ref}$ represent the grid-connected current commands of axis d and axis q respectively.

In step S1, rules for group-based OC fault diagnosis are as follows:

TABLE 1

Rules for group-based OC fault diagnosis

| Group-based fault | Range in which the zero domain occurs | $zs_{n2z} + zs_{p2z}$ | pf |
|---|---|---|---|
| $F_{X1/4}$ | $(t_{n2z} + D_{th}, T_s-D_{th}) \cup (D_{th}, t_{p2z}-D_{th})$ | 1 | pf ≥ 0 |
|  | $(t_{n2z} + D_{th}, t_{p2z}$-Dth) | 1 | pf < 0 |
| $F_{X2/3}$ | $(t_{p2z} + D_{th}, t_{n2z}$-Dth) | 1 | pf ≥ 0 |
|  | $(t_{p2z} + D_{th}, T_s-D_{th}) \cup (D_{th}, t_{n2z}-D_{th})$ | 1 | pf < 0 |

As described above, $F_{X1/4}$ and $F_{X2/3}$ represent group-based fault diagnosis signals, where the value 1 indicates that a faulty transistor is located in the group, and the value 0 indicates that the faulty transistor is not located in the group; $t_{n2z}$ and $t_{p2z}$ represent the theoretical zero crossing points; $D_{th}$ represents a first preset time threshold; $zs_{n2z}$ represents a zero-domain mark from the negative current to the zero current, where a value 1 indicates that the current is from a negative value to zero; $zs_{p2z}$ represents a zero-domain mark from the positive current to the zero current, where the value 1 indicates that the current is changed from the positive current to the zero current; pf represents the power factor; pf>0 indicates that the current leads a voltage; pf<0 indicates the current lags behind the voltage; and the zero domain indicates that the current is 0, namely, $i_X$=0.

In step S2, the specific switching signal is injected based on the group-based fault diagnosis signal. When $F_{X1/4}$ is 1, specific switching signals [$S_{A1}$, $S_{A3}$, $S_{A2}$, $S_{A4}$] are [1,0,0,0]; and when $F_{X2/3}$ is 1, the specific switching signals [$S_{A1}$, $S_{A3}$, $S_{A2}$, $S_{A4}$] are [0,0,1,0].

TABLE 2

Rules for equipment-based OC fault diagnosis

| Equipment-based fault | Group-based fault | [$S_{X1}$, $S_{X3}$, $S_{X2}$, $S_{X4}$] | \|i$_X$\| | N |
|---|---|---|---|---|
| $F_{X1}$ | $F_{X1/4}$ | [1, 0, 0, 0] | ≤$I_{th2}$ | ≥$N_{th}$ |
| $F_{X4}$ |  |  | >$I_{th2}$ | <$N_{th}$ |
| $F_{X2}$ | $F_{X2/3}$ | [0, 0, 1, 0] | ≤$I_{th2}$ | ≥$N_{th}$ |
| $F_{X3}$ |  |  | >$I_{th2}$ | <$N_{th}$ |

As described above, $I_{th2}$ represents a current threshold, N represents duration in which the current is in the zero domain, and $N_{th}$ represents a second preset time threshold. When $F_{X1}$ is 1, it indicates that switch transistor X1 is faulty. Similarly, when $F_{X2}$ is 1, it indicates that switch transistor X2 is faulty; when $F_{X3}$ is 1, it indicates that switch transistor X3 is faulty; when $F_{X4}$ is 1, it indicates that switch transistor X4 is faulty, where X=A, B, C.

The method summarizes characteristics of an OC fault of an IGBT under different power factors. Characteristics of OC fault diagnosis of $S_{X1}$ under different power factors are as follows:

a) Under a leading power factor: $t_1=t_2=t_{n2z}$, $t_4=t_{p2z}$, $zs_{p2z}=1$.

b) Under a unit power factor: $t_1=t_{n2z}$, $t_4=t_{p2z}$, $zs_{n2z}=1$.

c) Under a lagging power factor: $t_1=t_{n2z}$, 13=14=$t_{p2z}$, $zs_{n2z}=1$.

As described above, $t_1$ represents actual time from the negative current to the zero current, $t_2$ represents actual time from the zero current to the positive current, $t_3$ represents actual time from the positive current to the zero current, and $t_4$ represents actual time from the zero current to the negative current.

Characteristics of OC fault diagnosis of $S_X4$ under different power factors are as follows:

$$t_1 = t_{n2z}, t_4 = t_{p2z}, zs_{n2z} = 1, zs_{p2z} = 1$$

Characteristics of OC fault diagnosis of $S_{X2}$ under different power factors are as follows:
 a) Under the leading power factor: $t_2 = t_{n2z}$, $t_3 = t_4 = t_{p2z}$, $zs_{n2z} = 1$.
 b) Under the unit power factor: $t_2 = t_{n2z}$, $t_3 = t_{p2z}$, $zs_{p2z} = 1$.
 c) Under the lagging power factor: $t_1 = t_2 = t_{n2z}$, $t_3 = t_{p2z}$, $zs_{p2z} = 1$.

Characteristics of OC fault diagnosis of $S_{X3}$ under different power factors are as follows:

$$t_2 = t_{n2z}, t_3 = t_{p2z}, zs_{n2z} = 1, zs_{p2z} = 1$$

This embodiment provides a simple method for diagnosing an OC fault of a grid-connected T²3L inverter based on instantaneous current distortion. Firstly, characteristics of an OC fault of an output current under various power factors are analyzed and summarized in detail to provide a theoretical basis for the proposed diagnosis method. Secondly, a hierarchical diagnosis scheme is proposed to identify group-based and equipment-based faults. Finally, effectiveness and superiority of this method are verified by a large number of experiments. Compared with existing fault diagnosis methods, this method is applicable to various power factors of a photovoltaic grid-connected system and other systems. No additional sensor or sampling circuit is required. A sampling frequency is equal to the switching frequency. Time of group-based and equipment-based OC fault diagnosis is about half of a basic cycle. The diagnosis method is applicable to different power factors (including the unit power factor, the leading power factor, and the lagging power factor). Simple calculation and logical judgment are achieved.

Embodiment 2

Figure 2:
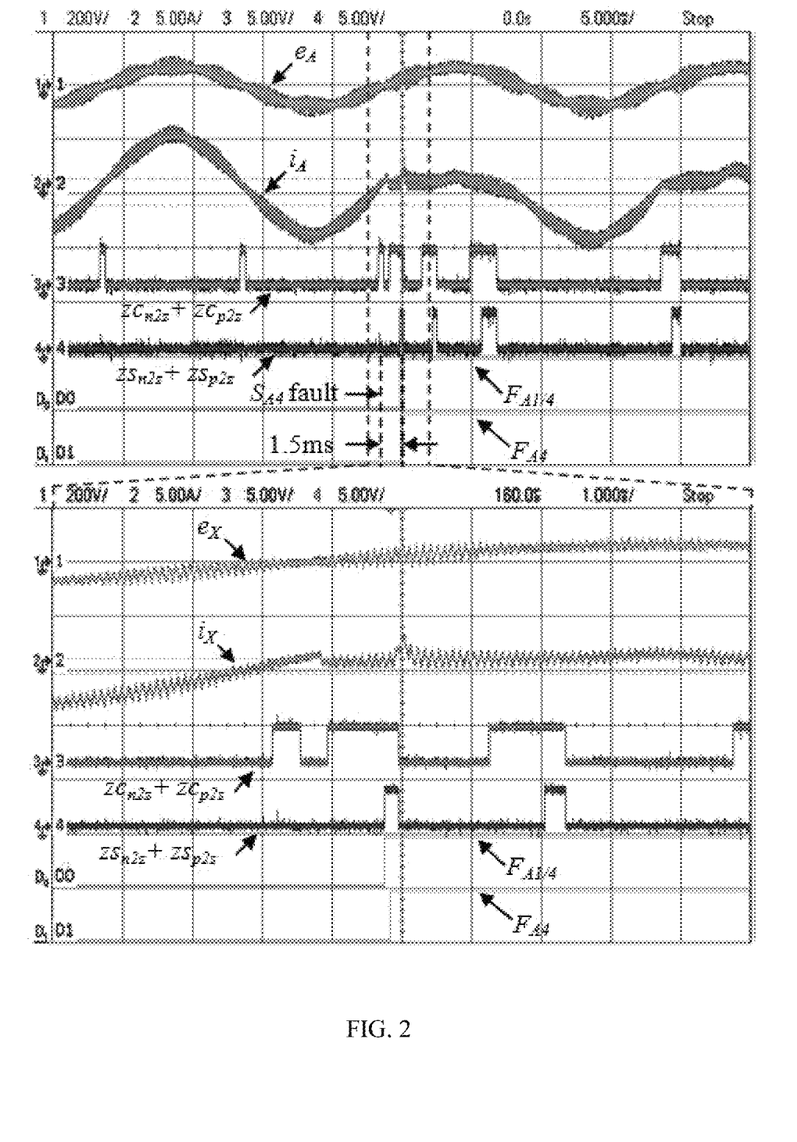
FIG. 2 is a schematic diagram showing a result of an OC fault diagnosis experiment under a unit power factor according to an embodiment of the present disclosure.
Figure 3:
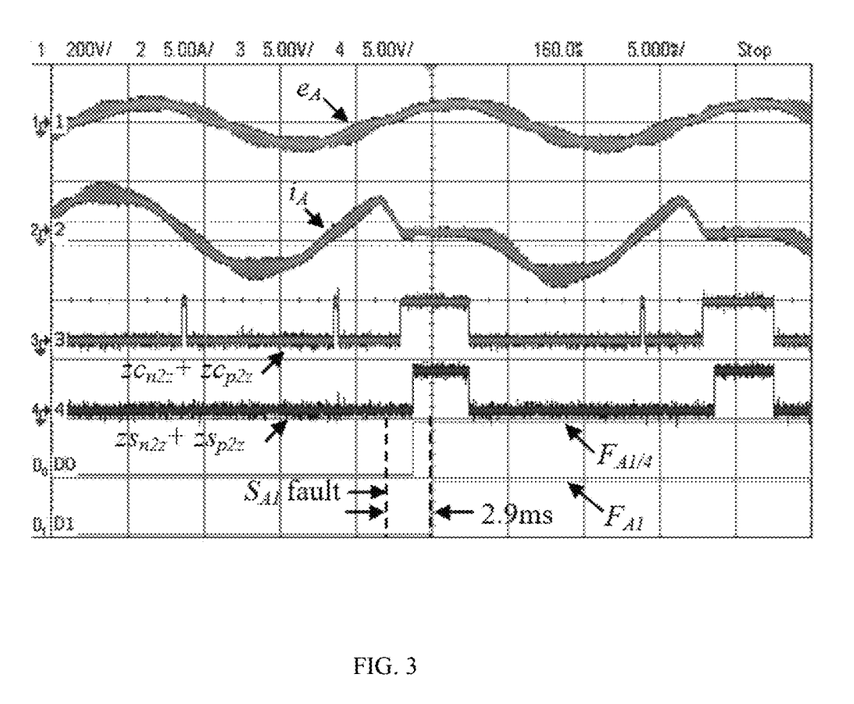
FIG. 3 is a schematic diagram showing a result of an OC fault diagnosis experiment under a leading power factor according to an embodiment of the present disclosure.
Figure 4:
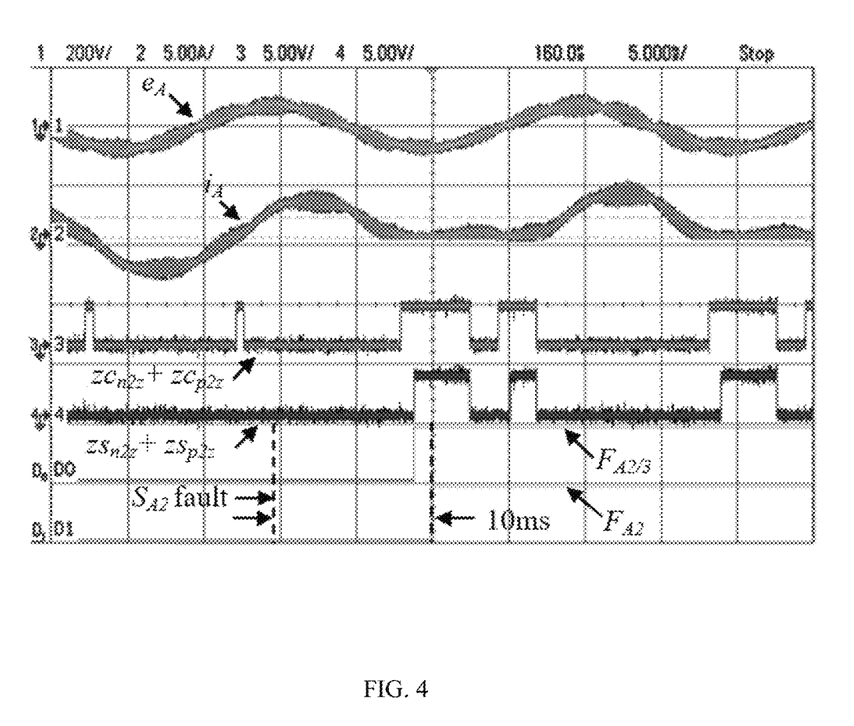
FIG. 4 is a schematic diagram showing a result of an OC fault diagnosis experiment under a lagging power factor according to an embodiment of the present disclosure.

To describe this embodiment more clearly, FIG. 2, FIG. 3 and FIG. 4 show experimental results under this embodiment. Main parameters used in the experimental results are shown in Table 3.

TABLE 3

Main parameters used in the experimental results

| Parameter | Symbol | Value |
| --- | --- | --- |
| Grid-side voltage | $e_X$ | 50 Vrms |
| Grid-side frequency | $f_{ac}$ | 50 Hz |
| Direct current (DC)-side voltage | $u_{dc}$ | 200 V |
| Switching/sampling frequency | $f_s$ | 10 kHz |
| Dead time | $T_D$ | 0.1 μs |
| Filter inductance | $L_f$ | 4 mH |
| DC-side capacitance | $C_{high/low}$ | 480 μF |
| Load power | P | 500 W |

FIG. 2 shows a result of OC fault diagnosis of $S_{A4}$ under a unit power factor. After an OC fault occurs on $S_{A4}$, the number of times that $zc_{n2z} + zc_{p2z}$ reaches a high level increases. A zero current lasts for a certain time and then becomes a zero domain, and $zs_{n2z} + zs_{p2z}$ reaches the high level. It is known, by determining positive and negative half cycles in which the zero domain occurs, that $S_{A1}$ or $S_{A4}$ may be faulty, namely, $F_{A1/4}$ is 1. A switching signal injection module sets switching signals [$S_{A1}$, $S_{A3}$, $S_{A2}$, $S_{A4}$] to [1,0,0,0]. If it is not zero, it indicates that $S_{A4}$ is faulty.

FIG. 3 shows a result of OC fault diagnosis of Sa under a leading power factor. FIG. 4 shows a result of OC fault diagnosis of $S_{A2}$ under a lagging power factor. When an OC fault occurs on an outer transistor ($S_{X1}$ or $S_{A2}$), a current of a fault phase is always zero after a specific signal is injected.

This embodiment is described for a specific OC fault, and an analysis result of another OC fault is the same as that in this embodiment.

Embodiment 3

This embodiment provides a system for diagnosing an OC fault of an IGBT under multiple power factors based on instantaneous current distortion, including:
 a parameter obtaining module configured to collect an output current $i_X$(X=A, B, C), grid-connected current commands $i_{d\_ref}$ and $i_{q\_ref}$, and a grid voltage $e_X$ of a T²3L inverter in real time, obtain a system parameter, namely, a switching cycle $T_s$, and calculate a theoretical zero crossing point to obtain positive and negative half-cycle regions;
 a group-based fault diagnosis module configured to calculate the theoretical zero crossing point to obtain the positive and negative half-cycle regions, determine positive and negative half cycles in which a zero domain occurs, perform group-based OC fault diagnosis, output a group-based fault diagnosis signal $F_{X1/4}$ or $F_{X2/3}$;
 a specific-switching signal injection module configured to inject a specific switching signal based on a group-based fault diagnosis result, where when $F_{X1/4}$ is 1, specific switching signals [$S_{A1}$, $S_{A3}$, $S_{A2}$, $S_{A4}$] are [1,0,0,0]; and when $F_{X2/3}$ is 1, the specific switching signals [$S_{A1}$, $S_{A3}$, $S_{A2}$, $S_{A4}$] are [0,0,1,0]; and
 an equipment-based fault diagnosis module configured to start to detect a state of a current of a fault phase when the specific signal is injected, where if the specific switching signals [$S_{A1}$, $S_{A3}$, $S_{A2}$, $S_{A4}$] are [1,0,0,0] and the current is always zero, $S_{A1}$ is faulty; or if the current is non-zero within specific time, $S_{A4}$ is faulty.

It should be pointed out that, based on needs of implementation, each step/component described in the present disclosure can be divided into more steps/components, or two or more steps/components or some operations of the steps/components can be combined into a new step/component to achieve the objective of the present disclosure.

It is easy for those skilled in the art to understand that the above-mentioned contents are merely the preferred embodiments of the present disclosure, and are not intended to limit the present disclosure. Any modifications, equivalent substitutions and improvements made within the spirit and principles of the present disclosure should fall within the protection scope of the present disclosure.

What is claimed is:

1. A method for diagnosing an open circuit (OC) fault of an insulated gate bipolar transistor (IGBT) of a T-type three-level (T²3L) inverter under multiple power factors based on instantaneous current distortion, comprising:
 collecting target parameters of a T²3L inverter in real time, wherein the target parameters comprise an output current $i_X$, a grid-connected current command $i_{d\_ref}$ of axis d, a grid-connected current command $i_{q\_ref}$ of axis q, a grid voltage $e_X$, and a switching cycle $T_s$, X represents a fault phase, X=A, B, C;
 calculating a theoretical zero crossing point based on the target parameters to obtain positive and negative half-cycle regions, determining positive and negative half cycles in which a zero domain occurs, performing group-based OC fault diagnosis, and outputting a group-based fault diagnosis signal;

injecting a specific switching signal to a space vector pulse width modulation (SVPWM) or sinusoidal pulse width modulation (SPWM) module based on the group-based fault diagnosis signal; and determining, based on a current value $i_X$ under the specific switching signal, whether a current is in the zero domain, performing equipment-based OC fault diagnosis, and outputting an equipment-based fault diagnosis signal, wherein when a power factor pf is greater than or equal to 0, theoretical zero crossing points $t_{p2z}$ and $t_{n2z}$ are obtained according to:

$$\begin{cases} t_{n2z} = t_{pf} \\ t_{p2z} = T_s/2 + t_{pf} \end{cases};$$

and when the power factor pf is less than 0, the theoretical zero crossing points $t_{p2z}$ and $t_{n2z}$ are obtained according to:

$$\begin{cases} t_{n2z} = t_{pf} \\ t_{p2z} = T_s/2 + t_{pf} \end{cases},$$

wherein $t_{p2z}$ represents time when the current changes from a positive current to a zero current, $t_{n2z}$ represents time when the current changes from a negative current to the zero current, $T_s$ represents the switching cycle, and $t_{pf}$ represents leading or lagging time under different power factors;

rules for group-based OC fault diagnosis are as follows:

| Group-based fault | Range in which the zero domain occurs | $zs_{n2z} + zs_{p2z}$ | pf |
|---|---|---|---|
| $F_{X1/4}$ | $(t_{n2z} + D_{th}, T_s\text{-}D_{th}) \cup (D_{th}, t_{p2z}\text{-}D_{th})$ | 1 | pf ≥ 0 |
| | $(t_{n2z} + D_{th}, t_{p2z}\text{-}D_{th})$ | 1 | pf < 0 |
| $F_{X2/3}$ | $(t_{p2z} + D_{th}, t_{n2z}\text{-}D_{th})$ | 1 | pf ≥ 0 |
| | $(t_{p2z} + D_{th}, T_s\text{-}D_{th}) \cup (D_{th}, t_{n2z}\text{-}D_{th})$ | 1 | pf < 0 | wherein, $F_{X1/4}$ and $F_{X2/3}$ represent group-based fault diagnosis signals, $t_{n2z}$ and $t_{p2z}$ represent the theoretical zero crossing points, $D_{th}$ represents a first preset time threshold, $zs_{n2z}$ represents a zero-domain mark from the negative current to the zero current, $zs_{p2z}$ represents a zero-domain mark from the positive current to the zero current, pf represents the power factor, pf>0 indicates that the current leads a voltage, and pf<0 indicates the current lags behind the voltage; when $F_{X1/4}$ is 1, it indicates that switch transistor X1 or switch transistor X4 is faulty, and when $F_{X2/3}$ is 1, it indicates that switch transistor X2 or switch transistor X3 is faulty; and in the step of injecting a specific switching signal to an SVPWM or SPWM module based on the group-based fault diagnosis signal:

when $F_{X1/4}$ is 1, specific switching signals $[S_{A1}, S_{A3}, S_{A2}, S_{A4}]$ are [1,0,0,0]; and when $F_{X2/3}$ is 1, the specific switching signals $[S_{A1}, S_{A3}, S_{A2}, S_{A4}]$ are [0,0,1,0]; and rules for equipment-based OC fault diagnosis are as follows:

| Equipment-based fault | Group-based fault | $[S_{X1}, S_{X3}, S_{X2}, S_{X4}]$ | $\|i_X\|$ | N |
|---|---|---|---|---|
| $F_{X1}$ | $F_{X1/4}$ | [1, 0, 0, 0] | $\leq I_{th2}$ | $\geq N_{th}$ |
| $F_{X4}$ | | | $> I_{th2}$ | $< N_{th}$ |
| $F_{X2}$ | $F_{X2/3}$ | [0, 0, 1, 0] | $\leq I_{th2}$ | $\geq N_{th}$ |
| $F_{X3}$ | | | $> I_{th2}$ | $< N_{th}$ | wherein, $I_{th2}$ represents a preset current threshold, N represents duration in which the current is in the zero domain, $N_{th}$ represents a second preset time threshold, and $F_{XY}$ (Y=1, 2, 3, 4) represents the equipment-based fault diagnosis signal, when Fri is 1, it indicates that switch transistor X1 is faulty; when $F_{X2}$ is 1, it indicates that switch transistor X2 is faulty; when $F_{X3}$ is 1, it indicates that switch transistor X3 is faulty; and when $F_{X4}$ is 1, it indicates that switch transistor X4 is faulty.

2. The method according to claim 1, wherein the leading or lagging time $t_{pf}$ under different power factors is obtained according to:

$$t_{pf} = \frac{\theta}{2\pi f_s},$$

wherein θ represents a power factor angle, and $f_s$ represents a switching frequency.

3. The method according to claim 2, wherein the power factor angle θ is obtained according to:

$$\cos(\theta) = \frac{i_{d\_ref}}{\sqrt{i_{d\_ref}^2 + i_{q\_ref}^2}},$$

wherein $i_{d\_ref}$ and $i_{q\_ref}$ represent the grid-connected current commands of axis d and axis q respectively.

4. A system for diagnosing an OC fault of an IGBT of a $T^2 3L$ inverter under multiple power factors based on instantaneous current distortion, comprising:

a parameter obtaining module configured to collect target parameters of a $T^2 3L$ inverter in real time, wherein the target parameters comprise an output current $i_X$, a grid-connected current command $i_{d\_ref}$ of axis d, a grid-connected current command $i_{q\_ref}$ of axis q, a grid voltage $e_X$, and a switching cycle $T_s$, and X represents a fault phase, wherein X=A, B, C;

a group-based fault diagnosis module configured to calculate a theoretical zero crossing point based on the target parameters to obtain positive and negative half-cycle regions, determine positive and negative half cycles in which a zero domain occurs, perform group-based OC fault diagnosis, and output a group-based fault diagnosis signal;

a specific-switching signal injection module configured to inject a specific switching signal to an SVPWM or SPWM module based on the group-based fault diagnosis signal; and an equipment-based fault diagnosis module configured to determine, based on a current value $i_X$ under the specific switching signal, whether a current is in the zero domain, perform equipment-based OC fault diagnosis, and output an equipment-based fault diagnosis signal, wherein when a power factor pf is greater than or equal to 0, theoretical zero crossing points $t_{p2z}$ and $t_{n2z}$ are obtained according to:

$$\begin{cases} t_{n2z} = t_{pf} \\ t_{p2z} = T_s/2 + t_{pf} \end{cases};$$

and when the power factor pf is less than 0, the theoretical zero crossing points $t_{p2z}$ and $t_{n2z}$ are obtained according to:

$$\begin{cases} t_{n2z} = t_{pf} \\ t_{p2z} = T_s/2 + t_{pf} \end{cases},$$

wherein $t_{p2z}$ represents time when the current changes from a positive current to a zero current, $t_{n2z}$ represents time when the current changes from a negative current to the zero current, $T_s$ represents the switching cycle, and $t_{pf}$ represents leading or lagging time under different power factors;

rules for group-based OC fault diagnosis are as follows:

| Group-based fault | Range in which the zero domain occurs | $zs_{n2z} + zs_{p2z}$ | pf |
|---|---|---|---|
| $F_{X1/4}$ | $(t_{n2z} + D_{th}, T_s\text{-}D_{th}) \cup (D_{th}, t_{p2z}\text{-}D_{th})$ | 1 | pf ≥ 0 |
|  | $(t_{n2z} + D_{th}, t_{p2z}\text{-}D_{th})$ | 1 | pf < 0 |
| $F_{X2/3}$ | $(t_{p2z} + D_{th}, t_{n2z}\text{-}D_{th})$ | 1 | pf ≥ 0 |
|  | $(t_{p2z} + D_{th}, T_s\text{-}D_{th}) \cup (D_{th}, t_{n2z}\text{-}D_{th})$ | 1 | pf < 0 | wherein, $F_{X1/4}$ and $F_{X2/3}$ represent group-based fault diagnosis signals, $t_{n2z}$ and $t_{p2z}$ represent the theoretical zero crossing points, $D_{th}$ represents a first preset time threshold, $zs_{n2z}$ represents a zero-domain mark from the negative current to the zero current, $zs_{p2z}$ represents a zero-domain mark from the positive current to the zero current, pf represents the power factor, pf>0 indicates that the current leads a voltage, and pf<0 indicates the current lags behind the voltage; when $F_{X1/4}$ is 1, it indicates that switch transistor X1 or switch transistor X4 is faulty, and when $F_{X2/3}$ is 1, it indicates that switch transistor X2 or switch transistor X3 is faulty;

in the step of injecting a specific switching signal to an SVPWM or SPWM module based on the group-based fault diagnosis signal:

when $F_{X1/4}$ is 1, specific switching signals $[S_{A1}, S_{A3}, S_{A2}, S_{A4}]$ are [1,0,0,0]; and when $F_{X2/3}$ is 1, the specific switching signals $[S_{A1}, S_{A3}, S_{A2}, S_{A4}]$ are [0,0,1,0]; and rules for equipment-based OC fault diagnosis are as follows:

| Equipment-based fault | Group-based fault | $[S_{X1}, S_{X3}, S_{X2}, S_{X4}]$ | $|i_X|$ | N |
|---|---|---|---|---|
| $F_{X1}$ | $F_{X1/4}$ | [1, 0, 0, 0] | $\leq I_{th2}$ | $\geq N_{th}$ |
| $F_{X4}$ |  |  | $> I_{th2}$ | $< N_{th}$ |
| $F_{X2}$ | $F_{X2/3}$ | [0, 0, 1, 0] | $\leq I_{th2}$ | $\geq N_{th}$ |
| $F_{X3}$ |  |  | $> I_{th2}$ | $< N_{th}$ | wherein, $I_{th2}$ represents a preset current threshold, N represents duration in which the current is in the zero domain, $N_{th}$ represents a second preset time threshold, and $F_{XY}$(Y=1, 2, 3, 4) represents the equipment-based fault diagnosis signal, when Fri is 1, it indicates that switch transistor X1 is faulty; when $F_{X2}$ is 1, it indicates that switch transistor X2 is faulty; when $F_{X3}$ is 1, it indicates that switch transistor X3 is faulty; and when $F_{X4}$ is 1, it indicates that switch transistor X4 is faulty.

5. A computer-readable storage medium, which stores a computer program, wherein the computer program is executed by a processor to implement the steps of the method according to claim 1.

\* \* \* \* \*